(12) United States Patent
Li et al.

(10) Patent No.: US 12,048,139 B2
(45) Date of Patent: Jul. 23, 2024

(54) MANUFACTURING METHOD OF SEMICONDUCTOR STRUCTURE USING FIRST MASK LAYER AND FIRST PHOTORESIST LAYER TO SELECTIVELY ETCH STACK ON COMPLETE DIE REGION

(71) Applicant: CHANGXIN MEMORY TECHNOLOGIES, INC., Hefei (CN)

(72) Inventors: Sen Li, Hefei (CN); Jun Xia, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 405 days.

(21) Appl. No.: 17/438,436

(22) PCT Filed: Jun. 11, 2021

(86) PCT No.: PCT/CN2021/099874
§ 371 (c)(1),
(2) Date: Sep. 12, 2021

(87) PCT Pub. No.: WO2022/028113
PCT Pub. Date: Feb. 10, 2022

(65) Prior Publication Data
US 2023/0055977 A1    Feb. 23, 2023

(30) Foreign Application Priority Data
Aug. 5, 2020    (CN) .......................... 202010779931.1

(51) Int. Cl.
*H10B 12/00* (2023.01)
(52) U.S. Cl.
CPC ................... *H10B 12/09* (2023.02)

(58) Field of Classification Search
CPC ....................................................... H10B 12/09
See application file for complete search history.

(56) References Cited

U.S. PATENT DOCUMENTS 6,713,236 B2    3/2004    Chen
9,324,570 B1*   4/2016    Liou ................. H01L 29/66795
(Continued)

FOREIGN PATENT DOCUMENTS

CN    102456542 A    5/2012
CN    106158594 A    11/2016
(Continued)

OTHER PUBLICATIONS

International Search Report as cited in PCT/CN2021/099874 mailed Sep. 13, 2021, 11 pages.

*Primary Examiner* — Michael Jung
(74) *Attorney, Agent, or Firm* — Kilpatrick Townsend & Stockton LLP

(57) ABSTRACT

The present disclosure provides a manufacturing method of a semiconductor structure and a semiconductor structure. The manufacturing method includes: providing a substrate, where the substrate includes a complete die region and an incomplete die region; forming a stack on the substrate; forming a first mask layer with a first pattern on the stack; forming a first photoresist layer on the first mask layer; exposing the first photoresist layer, and developing to remove the first photoresist layer on the complete die region; and etching the stack by using the first mask layer on the complete die region and the first photoresist layer on the incomplete die region as masks.

14 Claims, 14 Drawing Sheets

(56) References Cited

U.S. PATENT DOCUMENTS

| | | | |
|---|---|---|---|
| 9,659,940 B2 | 5/2017 | Park et al. | |
| 9,786,630 B2 | 10/2017 | Ota et al. | |
| 2017/0077103 A1* | 3/2017 | Park | H10B 12/315 |
| 2017/0184958 A1 | 6/2017 | Kawamura et al. | |

FOREIGN PATENT DOCUMENTS

| | | |
|---|---|---|
| CN | 106920769 A | 7/2017 |
| CN | 108336068 A | 7/2018 |
| CN | 108717936 A | 10/2018 |
| CN | 112885772 A | 6/2021 |
| JP | 2012209350 A | 10/2012 |

\* cited by examiner

US 12,048,139 B2

1

MANUFACTURING METHOD OF SEMICONDUCTOR STRUCTURE USING FIRST MASK LAYER AND FIRST PHOTORESIST LAYER TO SELECTIVELY ETCH STACK ON COMPLETE DIE REGION

CROSS-REFERENCE TO RELATED APPLICATIONS

The present disclosure claims the benefit and priority of Chinese Patent Application No. 202010779931.1, filed with China National Intellectual Property Administration (CNIPA) on Aug. 5, 2020 and titled "MANUFACTURING METHOD OF SEMICONDUCTOR STRUCTURE AND SEMICONDUCTOR STRUCTURE", the disclosure of which is incorporated by reference herein in its entirety as part of the present disclosure.

TECHNICAL FIELD

The present disclosure relates to, but is not limited to, a manufacturing method of a semiconductor structure and a semiconductor structure.

BACKGROUND

As a commonly used semiconductor memory device in computers, dynamic random access memory (DRAM) is composed of many repeated memory cells. Each memory cell typically includes a capacitor and a transistor. In the transistor, the gate is connected to the word line, the drain is connected to the bit line, and the source is connected to the capacitor. The voltage signal on the word line controls the transistor to turn on or off, and then the data information stored in the capacitor is read through the bit line, or data information is written into the capacitor through the bit line for storage.

With the evolution of the manufacturing process, the integration level of the DRAM is increasing, and the lateral size of the component is constantly shrinking, which leads to a higher aspect ratio of the capacitor, making the manufacturing process more difficult. Specifically, the pattern on the incomplete die region at the edge of the wafer may collapse and peel off during the etching process, which will cause contamination of the wafer and the wafer processing chamber, thereby reducing the yield of the product.

SUMMARY

An overview of the subject matter detailed in the present disclosure is provided below, which is not intended to limit the protection scope of the claims.

According to some embodiments, the present disclosure provides a manufacturing method of a semiconductor structure, including:
  providing a substrate, where the substrate includes a complete die region and an incomplete die region;
  forming a stack on the substrate, where the stack includes sacrificial layers and supporting layers;
  forming a first mask layer with a first pattern on the stack;
  forming a first photoresist layer on the first mask layer;
  exposing the first photoresist layer, and developing to remove the first photoresist layer on the complete die region; and
  etching the stack by using the first mask layer on the complete die region and the first photoresist layer on the incomplete die region as masks.

2

The present disclosure further provides a semiconductor structure.

According to an embodiment of the present disclosure, the semiconductor structure may be formed by the above manufacturing method of a semiconductor structure.

Other aspects of the present disclosure are understandable upon reading and understanding the drawings and detailed description.

BRIEF DESCRIPTION OF THE DRAWINGS

The drawings incorporated into the specification and constituting a part of the specification illustrate the embodiments of the present disclosure, and are used together with the description to explain the principles of the embodiments of the present disclosure. In these drawings, similar reference numerals are used to represent similar elements. The drawings in the following description are a part rather than all of the embodiments of the present disclosure. Persons of ordinary skill in the art may obtain other drawings based on these drawings without creative efforts.

DETAILED DESCRIPTION

The present disclosure proposes a manufacturing method of a semiconductor structure, which is described below with reference to the accompanying drawings and specific implementations.

Figure 1:
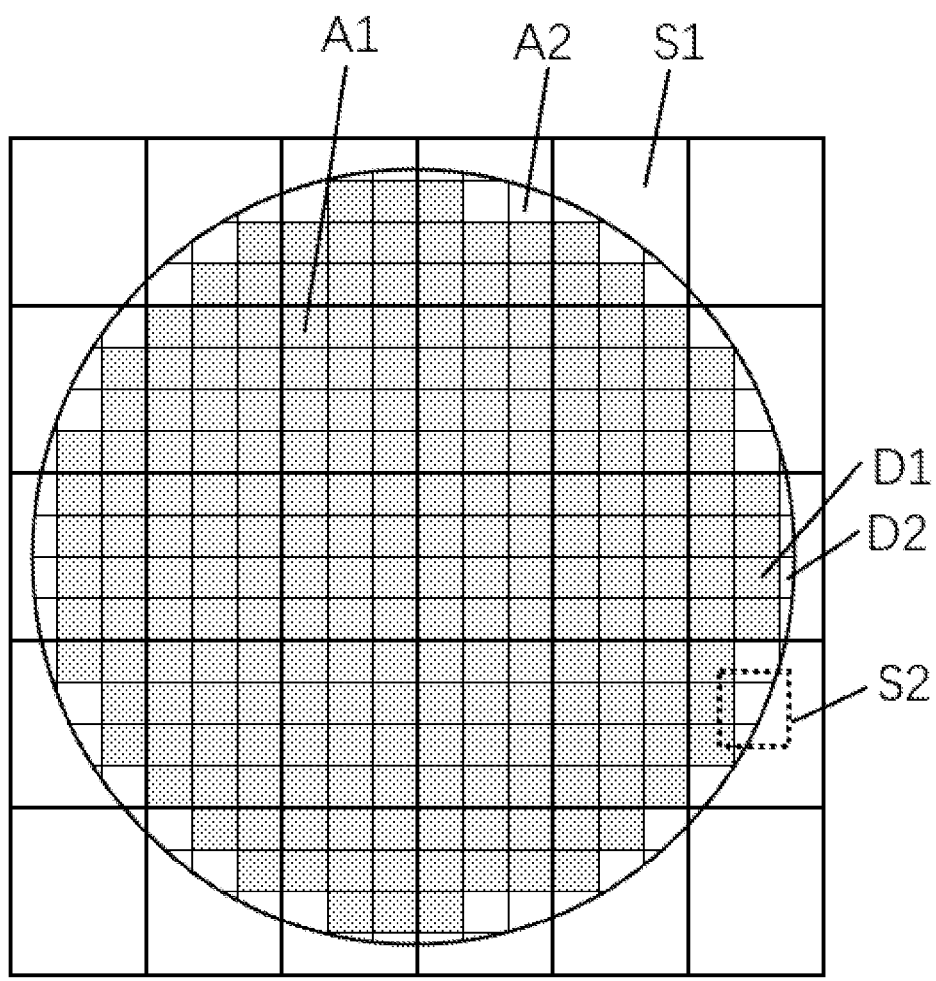
FIG. 1 is a schematic diagram of a wafer according to an embodiment of the present disclosure.
Figure 2:
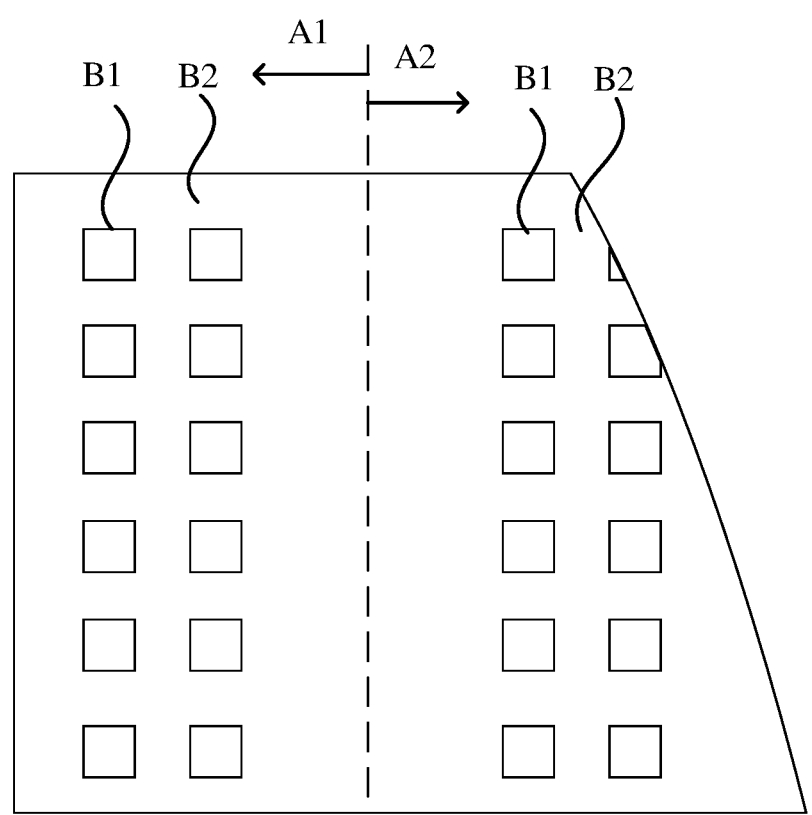
FIG. 2 is an enlarged partial view of a complete die D1 and an incomplete die D2 shown in FIG. 1.

FIG. 1 is a schematic diagram of a wafer according to an embodiment of the present disclosure; FIG. 2 is an enlarged partial view of a complete die D1 and an incomplete die D2 shown in FIG. 1. Referring to FIGS. 1 and 2, a wafer is exposed to form a complete die region A1 and an incomplete die region A2 by using an exposure map composed of a plurality of exposure units S1. A single exposure unit S1 is a region for a single exposure by using a photomask. A single exposure unit S1 may include a plurality of dies. For example, as shown in FIG. 1, a single exposure unit S1 includes 12 dies arranged in 4 rows and 3 columns.

The wafer includes a complete die region A1 and an incomplete die region A2. The complete die region A1 is composed of complete dies D1 inside the wafer, and the incomplete die region A2 is composed of incomplete dies D2 at the periphery of the wafer. The incomplete die region A2 is located at the periphery of the complete die region A1. The complete die D1 is a die that is completely on the wafer; the incomplete die D2 is a die that is partially on the wafer. The complete die D1 includes a device region B1 and a peripheral region B2, and the peripheral region B2 surrounds the device region B1. The incomplete die D2 also includes a device region B1 and a peripheral region B2, and the peripheral region B2 surrounds the device region B1.

Figure 3:
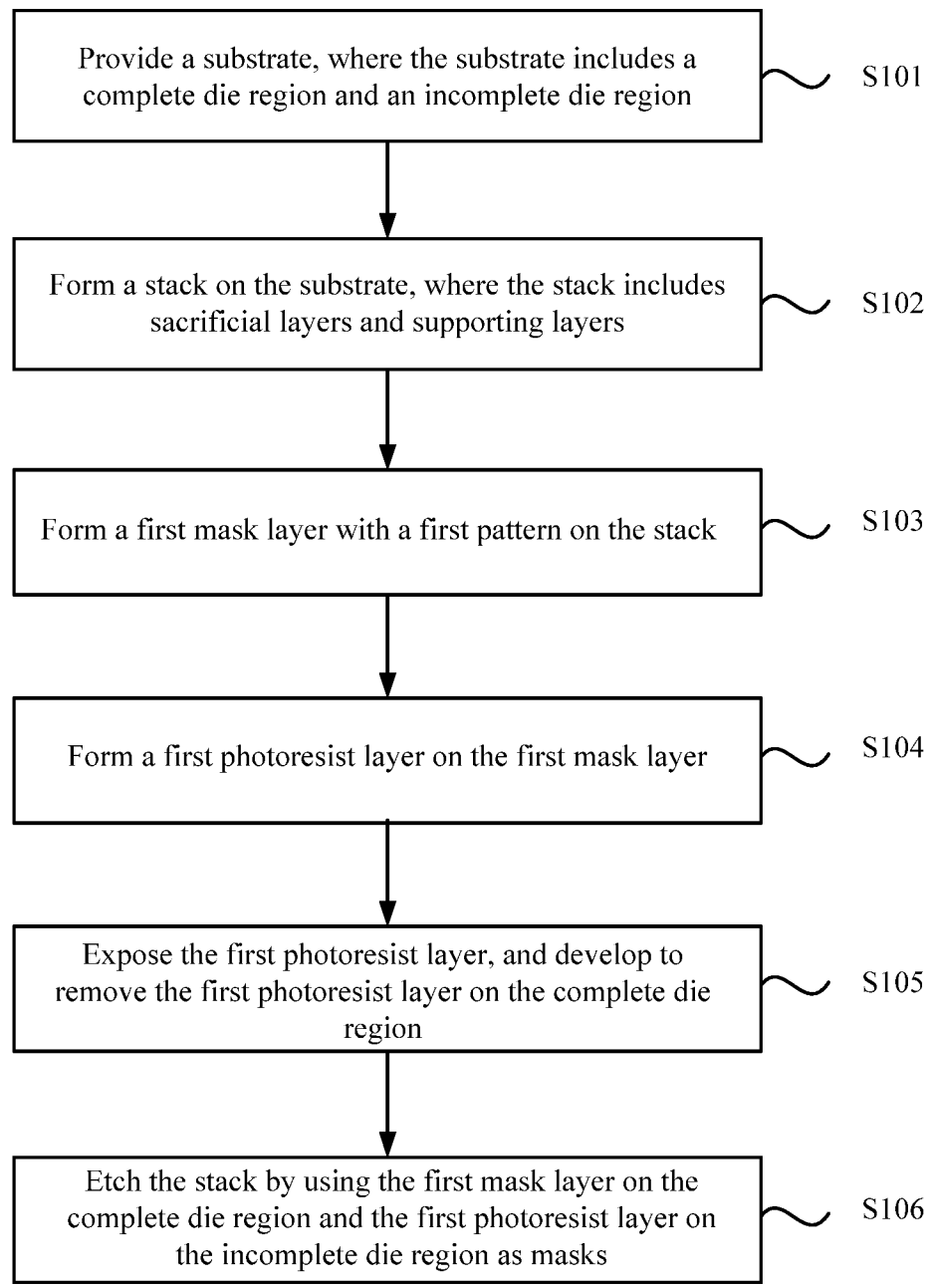
FIG. 3 is a flowchart of a manufacturing method of a semiconductor structure according to an embodiment of the present disclosure.

FIG. 3 is a flowchart of a manufacturing method of a semiconductor structure according to an embodiment of the present disclosure; FIGS. 5 to 18 show the manufacturing process of the semiconductor structure according to the embodiment. Referring to FIG. 3 and FIGS. 5 to 18, the manufacturing method of a semiconductor structure includes: S101: Provide a substrate 10, where the substrate 10 includes a complete die region A1 and an incomplete die region A2.

In this step, the substrate 10 may be made of monocrystalline silicon, polycrystalline silicon, amorphous silicon, silicon-germanium or silicon-on-insulator (SOI). The incomplete die region A2 is located at the periphery of the complete die region A1, and the incomplete die region A2 may surround the complete die region A1 in a circle.

S102: Form a stack on the substrate 10, where the stack includes sacrificial layers and supporting layers.

In this step, sacrificial layers and supporting layers stacked alternately are formed on the substrate 10. Exemplarily, the stack includes a first supporting layer 21, a first sacrificial layer 31, a second supporting layer 22, a second sacrificial layer 32 and a third supporting layer 23 along a direction away from the substrate 10. In other embodiments, the stack may also include other numbers of sacrificial layers and other numbers of supporting layers, which is not limited in the embodiment of the present disclosure.

S103: Form a first mask layer 51 with a first pattern on the stack.

In this step, the first mask layer 51 is formed on the stack on the complete die region A1, and the first mask layer 51 is formed on the stack on the incomplete die region A2.

In an embodiment, the first mask layer 51 may include a first mandrel layer 511 and a first sidewall layer 512. Specifically, the first mandrel layer 511 and the first sidewall layer 512 are formed by using a self-aligned double patterning (SADP) process. The first sidewall layer 512 is conformally formed on a surface of the first mandrel layer 511. For example, the first sidewall layer 512 covers a sidewall and top of the first mandrel layer 511. The first sidewall layer 512 may also cover only the sidewall of the first mandrel layer 511, which is not limited here, and may be adjusted according to the actual process. It should be noted that the first mandrel layer 511 and the first sidewall layer 512 shown in FIG. 7 may be etched to form the structure of the first mask layer 51 in FIG. 8. That is, the part of the first sidewall layer 512 at the top of the first mandrel layer 511 is removed, and the part of the first sidewall layer 512 at the sidewall of the first mandrel layer 511 is retained.

S104: Form a first photoresist layer PR1 on the first mask layer 51.

In this step, the first photoresist layer PR1 is formed by covering the first mask layer 51 on the complete die region A1 and the incomplete die region A2.

S105: Expose the first photoresist layer PR1, and develop to remove the first photoresist layer PR1 on the complete die region A1.

In this step, the first photoresist layer PR1 is exposed and developed, such that the first photoresist layer PR1 on the complete die region A1 is removed, and the first photoresist layer PR1 on the incomplete die region A2 is retained. The first photoresist layer PR1 serves as a protective layer for the incomplete die region A2. The first photoresist layer PR1 is exposed by partial exposure, and developed to remove the first photoresist layer PR1 on the complete die region A1. In some feasible implementations, partial exposure may be achieved, for example, by shielding with a light shield. In other feasible implementations, partial exposure may be achieved, for example, by step exposure. The step exposure method will be further introduced below.

In this step, the first photoresist layer PR1 is exposed by partial exposure. For example, only the first photoresist layer PR1 on the complete die region A1 is exposed, or only the first photoresist layer PR1 on the incomplete die region A2 is exposed. The first photoresist layer PR1 on the complete die region A1 and that on the incomplete die region A2 are not exposed at the same time, such that after the development, the first photoresist layer PR1 on the complete die region A1 is removed, and the first photoresist layer PR1 on the incomplete die region A2 is retained.

S106: Etch the stack by using the first mask layer 51 on the complete die region A1 and the first photoresist layer PR1 on the incomplete die region A2 as masks.

In the manufacturing method of a semiconductor structure provided by the embodiment of the present disclosure, the first photoresist layer PR1 is formed before the stack is etched. In addition, the first photoresist layer PR1 on the complete die region A1 is removed, and the first photoresist layer PR1 on the incomplete die region A2 is retained. When the stack on the substrate 10 is etched, on the complete die region A1, the pattern may be transferred to the stack. On the incomplete die region A2, the first photoresist layer PR1 protects the stack on the incomplete die region A2 from being etched and patterned, thereby solving the problem that the edge of the wafer is prone to collapse and peeling during the formation of the semiconductor structure.

In an embodiment, referring to FIGS. 5 to 18, the manufacturing method of a semiconductor structure further includes:

Step 1: Form a transition layer 40 on the stack, where the first mask layer 51 is located on the transition layer 40.

In the embodiment of the present disclosure, this step is explained by taking a single-film layer as the transition layer 40 as an example, which is not a limitation of the present disclosure. In other implementations, the transition layer 40 may also be a multilayer film. The transition layer 40 may include, for example, one or any combination of a polycrystalline silicon layer, a silicon oxide layer, a silicon nitride layer, an amorphous carbon layer and a silicon oxynitride layer.

Step 2: Etch the transition layer 40 by using the first mask layer 51 on the complete die region A1 and the first photoresist layer PR1 on the incomplete die region A2 as masks.

Step 3: Etch the stack by using the transition layer 40 as a mask.

In the embodiment of the present disclosure, a transition layer 40 may further be formed on the stack, and a first mask layer 51 is formed on the transition layer 40. When the first mask layer 51 on the complete die region A1 and the first photoresist layer PR1 on the incomplete die region A2 are used as masks to etch the stack, Step 2 in the embodiment of the present disclosure may be carried out first before Step 3 in the embodiment of the present disclosure.

In an embodiment, the first photoresist layer PR1 is a negative photoresist layer.

Specifically, when the first photoresist layer PR1 is a negative photoresist layer, the step exposure method may be used to expose the first photoresist layer PR1 on the incomplete die region A2 without exposing the first photoresist layer PR1 on the complete die region A1. Since the incomplete die region A2 is only located at the periphery of the wafer and has a small area, the step exposure method to expose the first photoresist layer PR1 on the incomplete die region A2 can save the exposure time and reduce the production cost.

During the subsequent development, the first photoresist layer PR1 on the exposed incomplete die region A2 is retained, and the first photoresist layer PR1 on the non-exposed complete die region A1 is removed. It should be noted that the first photoresist layer PR1 on the complete die region A1 needs to be completely removed, the first photoresist layer PR1 on the device region B1 of the incomplete die D2 on the incomplete die region A2 needs to be retained, and the first photoresist layer PR1 in the peripheral region B2 of the incomplete die D2 on the incomplete die region A2 can be removed.

In an embodiment, the step exposure is carried out without using a photomask, and a light spot in the step exposure at least covers a single complete die. Since the first photoresist layer PR1 on the incomplete die region A2 needs to be retained, a maskless exposure method may be adopted, and a light spot S2 that can cover the area of a single complete die is used for exposure, which ensures the exposure effect and effectively reduces the cost.

In an embodiment, the area of the light spot S2 in the step exposure method is smaller than that of a single exposure unit S1. Preferably, the light spot S2 in the step exposure method exactly completely covers the area of a single complete die, which reduces the area of the light source, reduces the power consumption of the light source and saves the production cost.

In an embodiment, the first photoresist layer PR1 is a positive photoresist layer. The first photoresist layer PR1 on the complete die region A1 is exposed and developed to remove the first photoresist layer PR1 on the complete die region A1 and retain the first photoresist layer PR1 on the incomplete die region A2.

In an embodiment, referring to FIGS. 5 to 18, the manufacturing method of a semiconductor structure further includes: form a second mask layer 52 with a second pattern on the first mask layer 51, where the first photoresist layer PR1 is located on the second mask layer 52. In this step, the first pattern includes a first line (not shown in the figure) along a first direction, and the second pattern includes a second line (not shown in the figure) along a second direction. The first direction intersects the second direction, that is, the first direction is not parallel to the second direction. In the embodiment of the present disclosure, the second mask layer 52 is formed on the first mask layer 51. A region in which the first line of the first mask layer 51 intersects the second line of the second mask layer 52 is one where capacitor holes need to be formed by etching. The design of the first mask layer 51 and the second mask layer 52 facilitates the formation of small capacitor holes.

In an embodiment, referring to FIGS. 8 to 11, the second mask layer 52 includes a second mandrel layer 521 and a second sidewall layer 522, and the second sidewall layer 522 is formed on a surface of the second mandrel layer 521. The second mandrel layer 521 is located between the second sidewall layer 522 and the first mask layer 51. The second mandrel layer 521 has a pattern, and the second sidewall layer 522 is formed on the surface of the second mandrel layer 521. For example, the second sidewall layer 522 is located on a sidewall and top of the second mandrel layer 521. The second sidewall layer 522 may also cover only the sidewall of the second mandrel layer 521, which is not limited here, and may be adjusted according to the actual process.

In an embodiment, referring to FIGS. 5 to 18, the manufacturing method of a semiconductor structure further includes: form a second photoresist layer PR2 on the first photoresist layer PR1 of the incomplete die region A2 and on the complete die region A1 after the development. The second photoresist layer PR2 does not cover the device region B1 on the complete die region A1, but covers the peripheral region B2 on the complete die region A1. That is, on the complete die region A1, the second photoresist layer PR2 only covers the peripheral region B2, rather than the device region B1. The second photoresist layer PR2 does not cover the device region B1 on the incomplete die region A2, but covers the peripheral region B2 on the incomplete die region A2. That is, on the incomplete die region A2, the second photoresist layer PR2 only covers the peripheral region B2, rather than the device region B1. In the embodiment of the present disclosure, the first photoresist layer PR1 is formed before the second photoresist layer PR2 is formed. In addition, the first photoresist layer PR1 on the complete die region A1 is removed, and the first photoresist layer PR1 on the incomplete die region A2 is retained. When the stack on the substrate 10 is etched, on the incomplete die region A2, the first photoresist layer PR1 protects the stack on the incomplete die region A2 from being etched and patterned.

In an embodiment, referring to FIGS. 5 to 18, the manufacturing method of a semiconductor structure further includes: Step 1: Etch by using the transition layer 40, the first mask layer 51, the second mask layer 52, the first photoresist layer PR1 and the second photoresist layer PR2 as masks to form capacitor holes in the stack.

Figure 11:
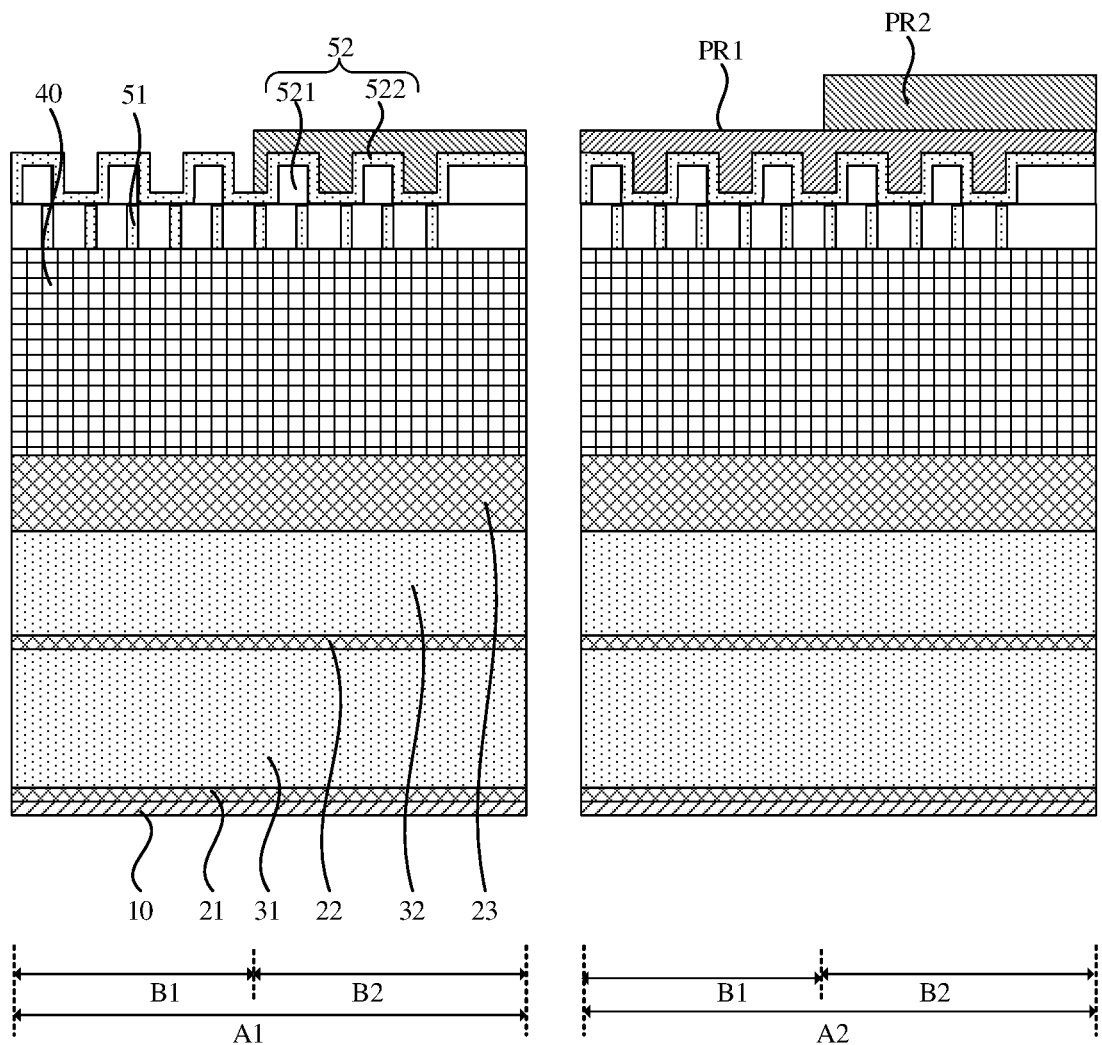
FIG. 11 is a schematic diagram of a structure obtained after forming a second photoresist layer PR2 on a first photoresist layer PR1 of an incomplete die region A2 and in a complete die region A1 after development by the manufacturing method of a semiconductor structure shown in FIG. 3.
Figure 12:
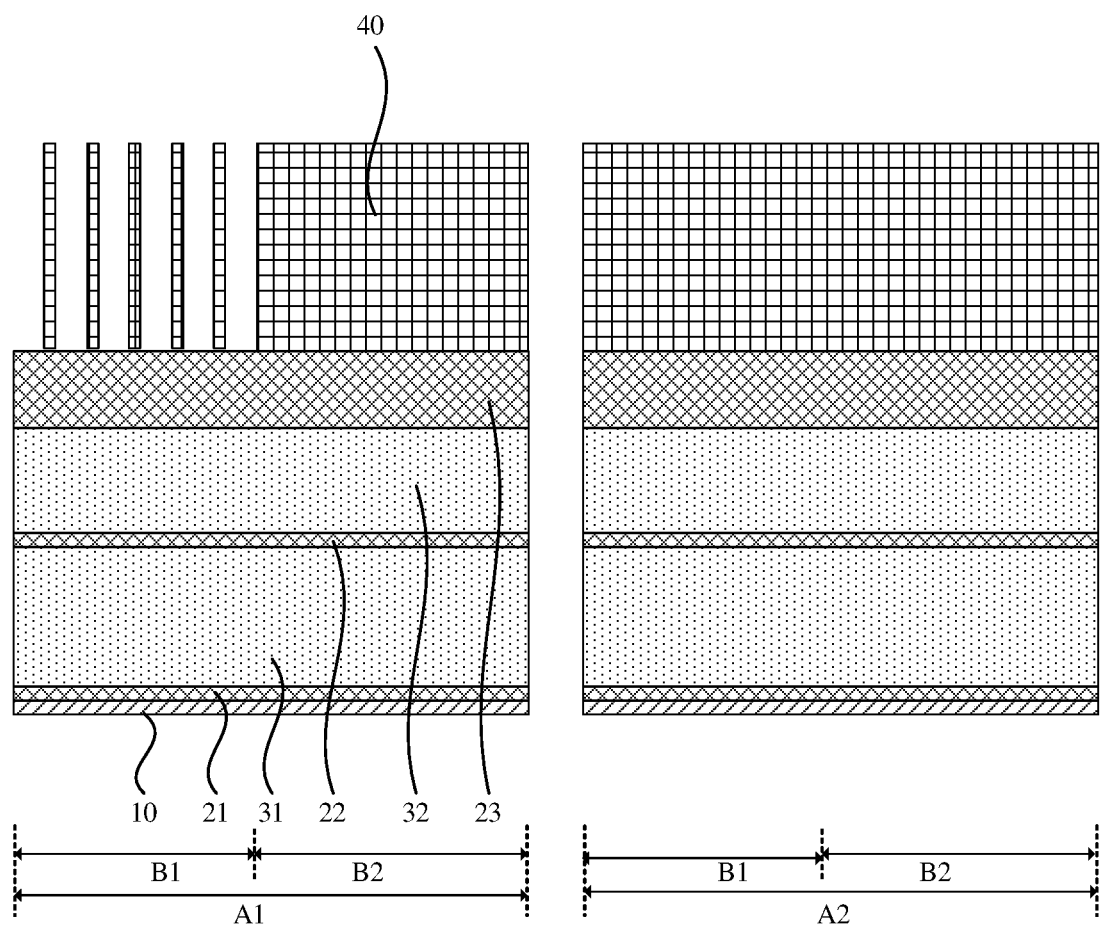
FIG. 12 is a schematic diagram of a structure obtained after etching the transition layer 40 by the manufacturing method of a semiconductor structure shown in FIG. 3.
Figure 13:
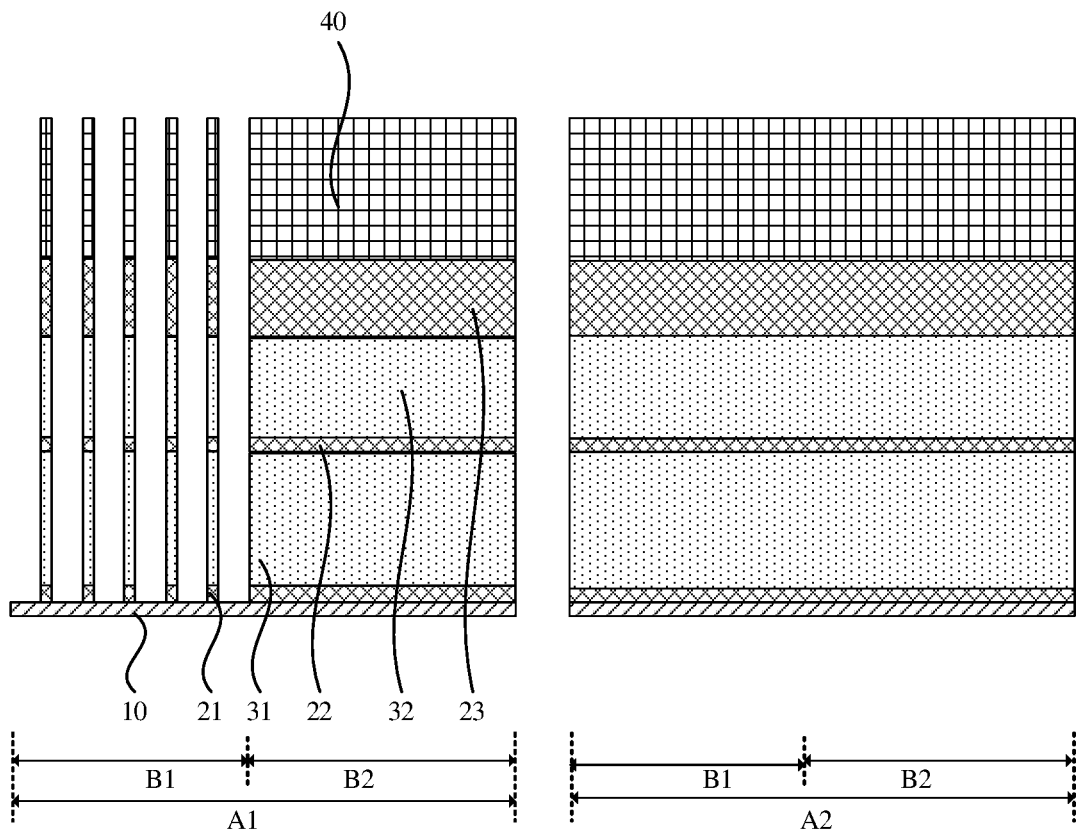
FIG. 13 is a schematic diagram of a structure obtained after implementing Step S106 of the manufacturing method of a semiconductor structure shown in FIG. 3.
Figure 14:
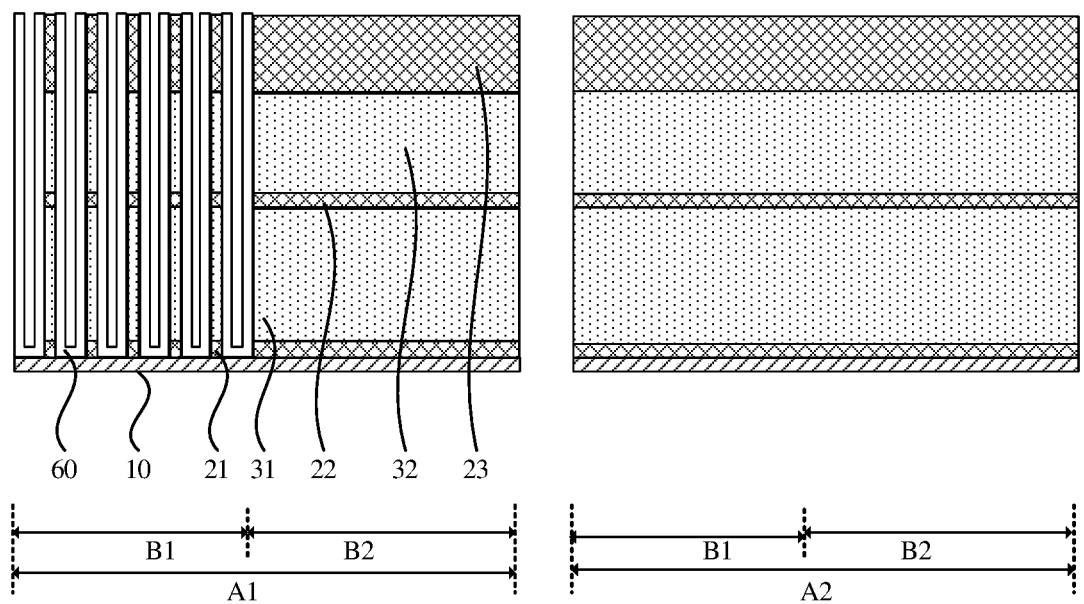
FIG. 14 is a schematic diagram of a structure obtained after forming bottom electrodes 60 in capacitor holes before implementing Step S207 of the manufacturing method of a semiconductor structure shown in FIG. 4.
Figure 15:
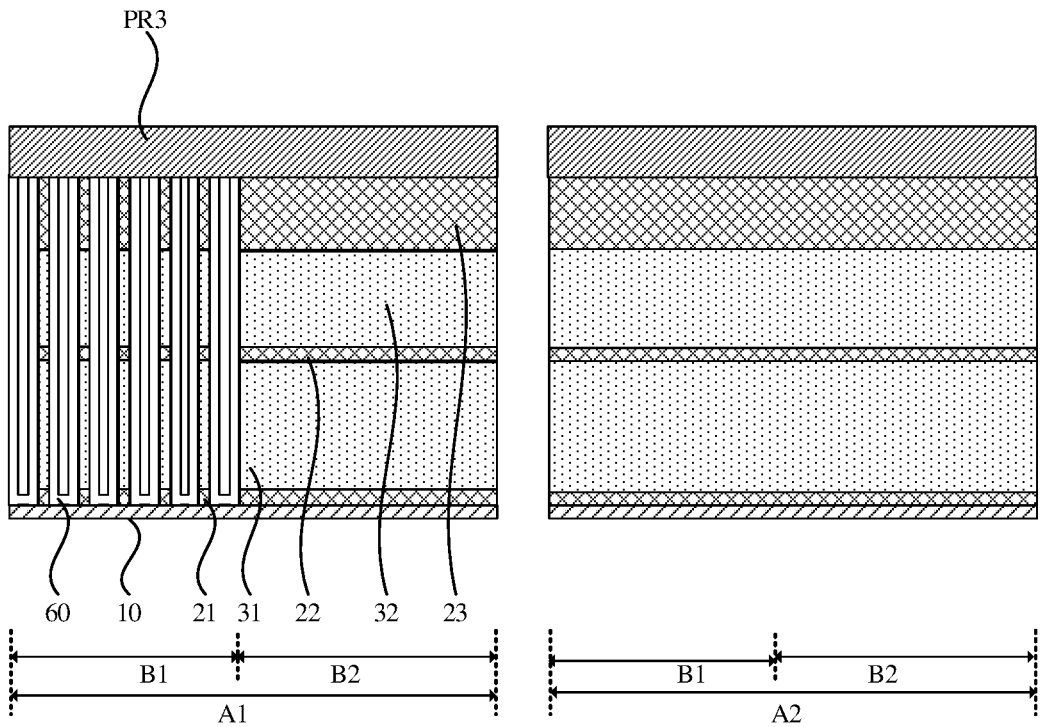
FIG. 15 is a schematic diagram of a structure obtained after implementing Step S207 of the manufacturing method of a semiconductor structure shown in FIG. 4.
Figure 16:
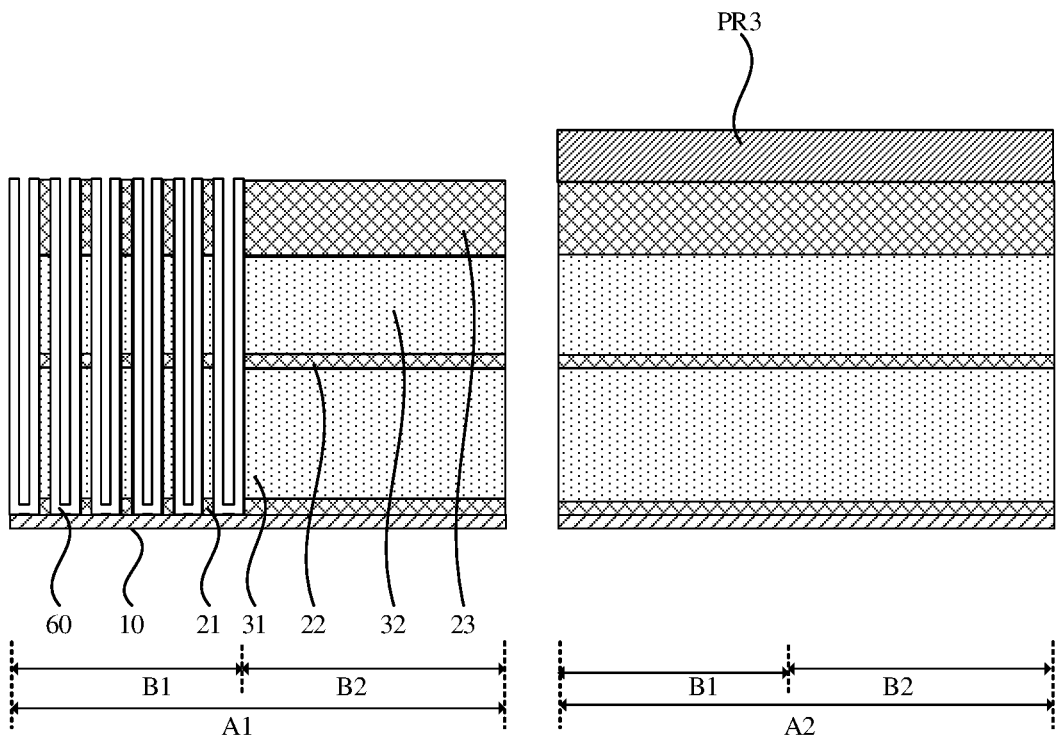
FIG. 16 is a schematic diagram of a structure obtained after implementing Step S208 of the manufacturing method of a semiconductor structure shown in FIG. 4.
Figure 17:
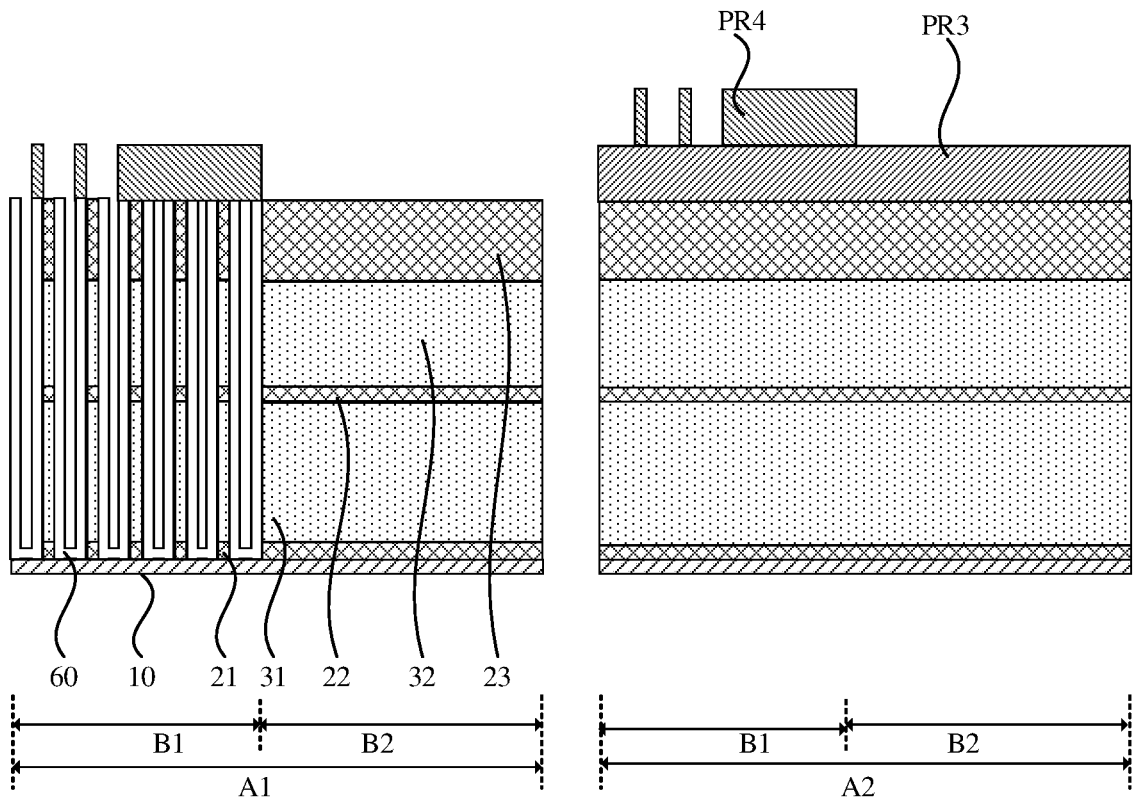
FIG. 17 is a schematic diagram of a structure obtained after implementing Step S209 of the manufacturing method of a semiconductor structure shown in FIG. 4.

In this step, exemplarily, referring to FIGS. 11 to 13, the first mask layer 51, the second mask layer 52, the first photoresist layer PR1 and the second photoresist layer PR2 are used as masks to etch the transition layer 40, and then the transition layer 40 is used as a mask to etch the stack to form capacitor holes in the stack. Since the transition layer 40 is not formed with an opening on the incomplete die region A2 or capacitor holes in the stack, the problem of collapse and peeling is not prone to occur at the periphery of the wafer.

Step 2: Form bottom electrodes 60 in the capacitor holes, where the bottom electrodes 60 cover sidewalls and the bottoms of the capacitor holes.

In this step, a metal layer is formed in the capacitor holes. A part of the metal layer above the capacitor hole is removed by a planarization or etching process, and a part of the metal layer in the capacitor holes is retained to form the bottom electrodes 60. The planarization process may be, for example, a chemical mechanical polishing (CMP) process.

In the embodiment of the present disclosure, a transition layer 40 may be formed on the stack, a second mask layer 52 may be formed on the first mask layer 51, and a second photoresist layer PR2 may be formed on the first photoresist layer PR1. When the first mask layer 51 on the complete die region A1 and the first photoresist layer PR1 on the incomplete die region A2 are used as masks to etch the stack, Step 1 in the embodiment of the present disclosure may be carried out first before Step 2 in the embodiment of the present disclosure is carried out to form capacitor holes and form the bottom electrodes 60 in the capacitor holes.

Figure 4:
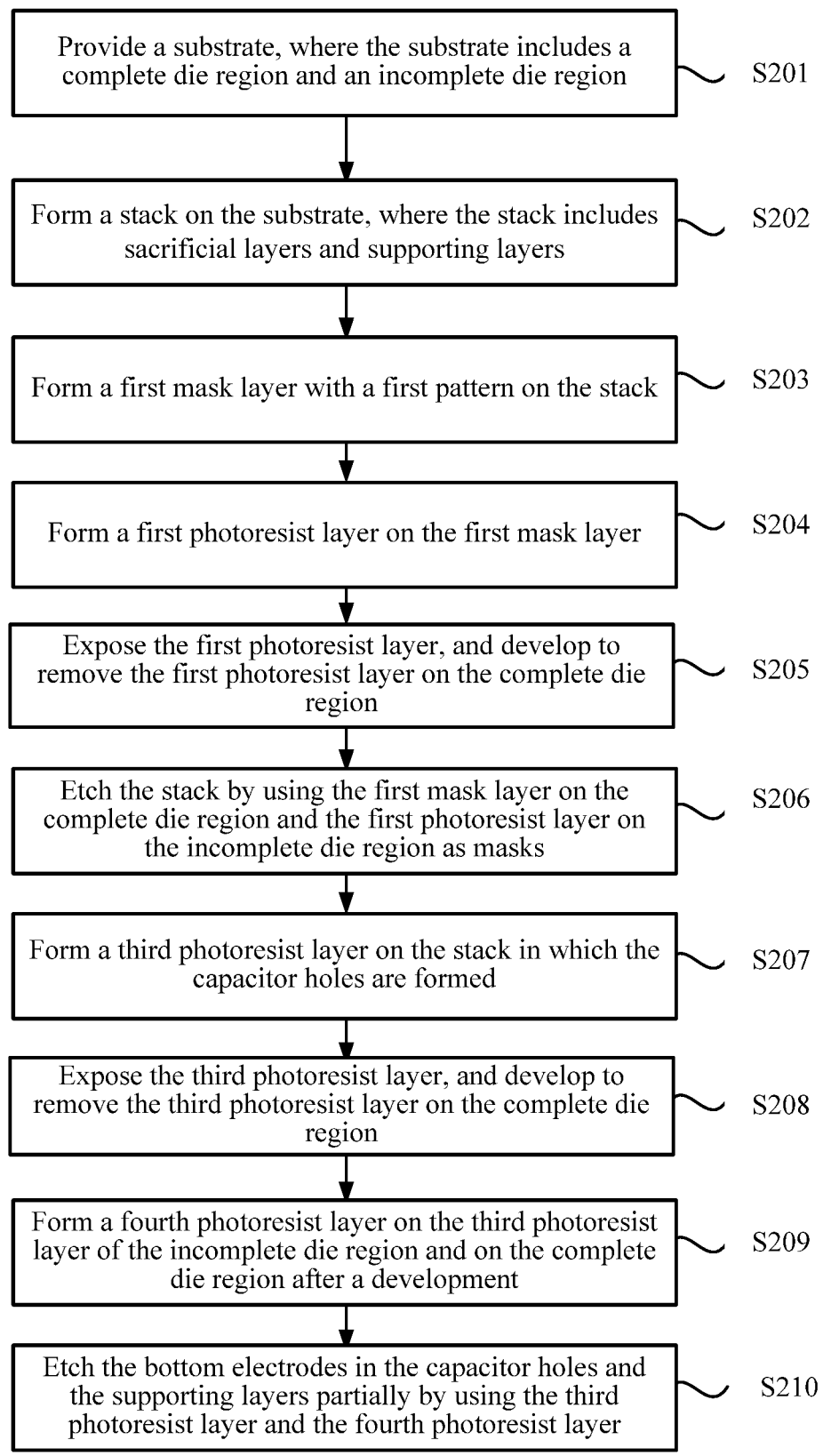
FIG. 4 is a flowchart of another manufacturing method of a semiconductor structure according to an embodiment of the present disclosure.
Figure 5:
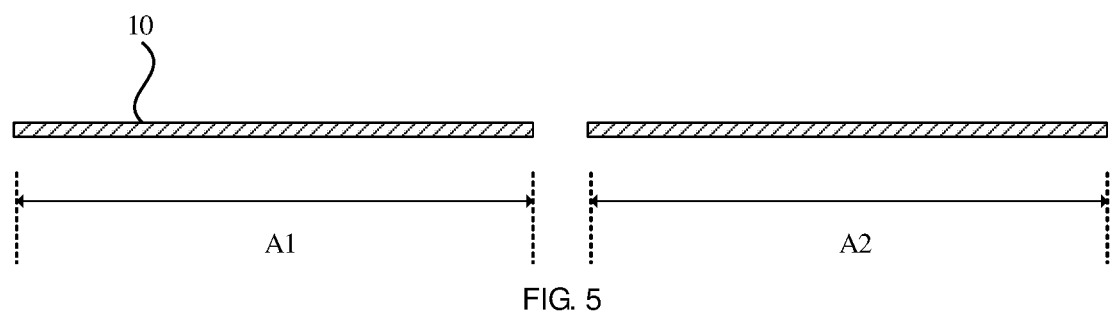
FIG. 5 is a schematic diagram of a substrate formed by Step S101 of the manufacturing method of a semiconductor structure shown in FIG. 3.
Figure 6:
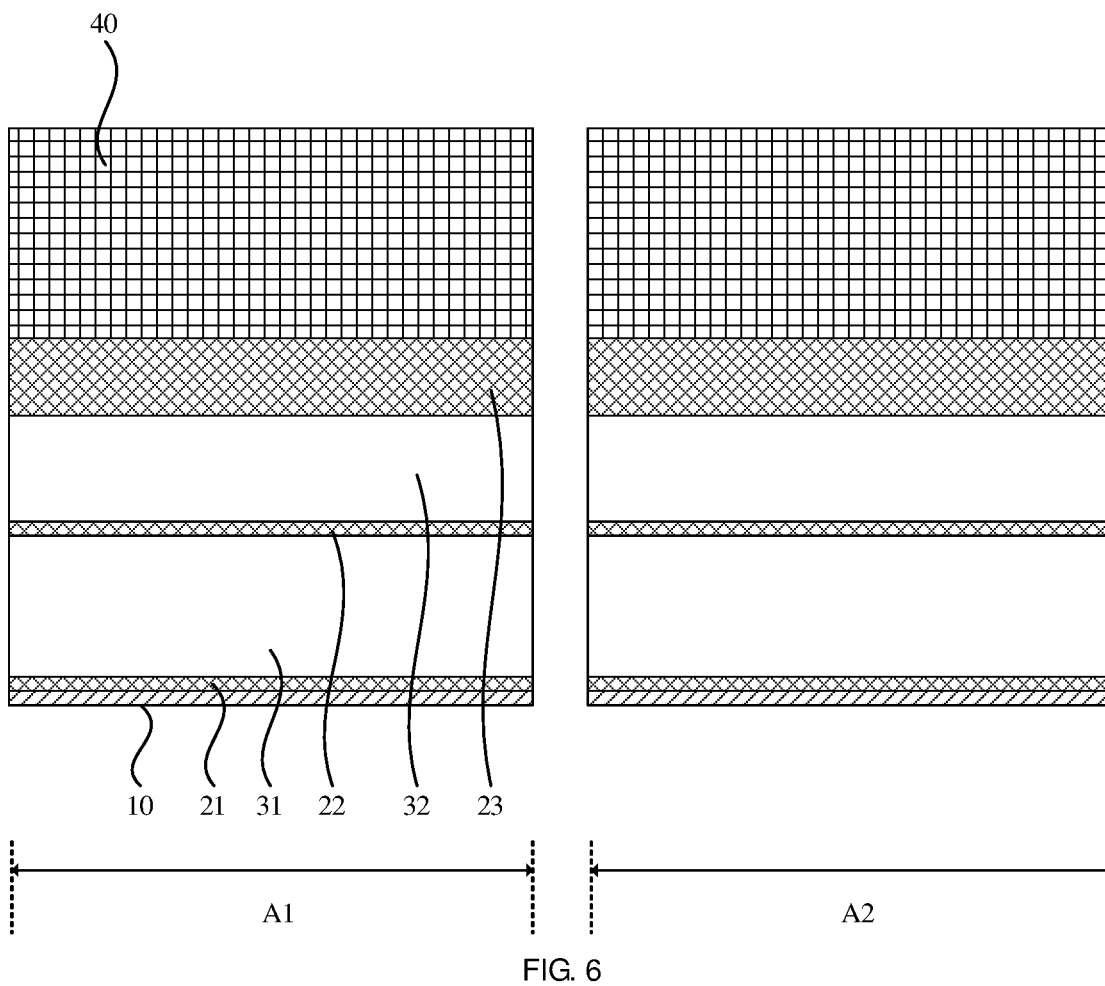
FIG. 6 is a schematic diagram of a structure obtained after forming a transition layer 40 on a stack formed by Step S102 of the manufacturing method of a semiconductor structure shown in FIG. 3.
Figure 7:
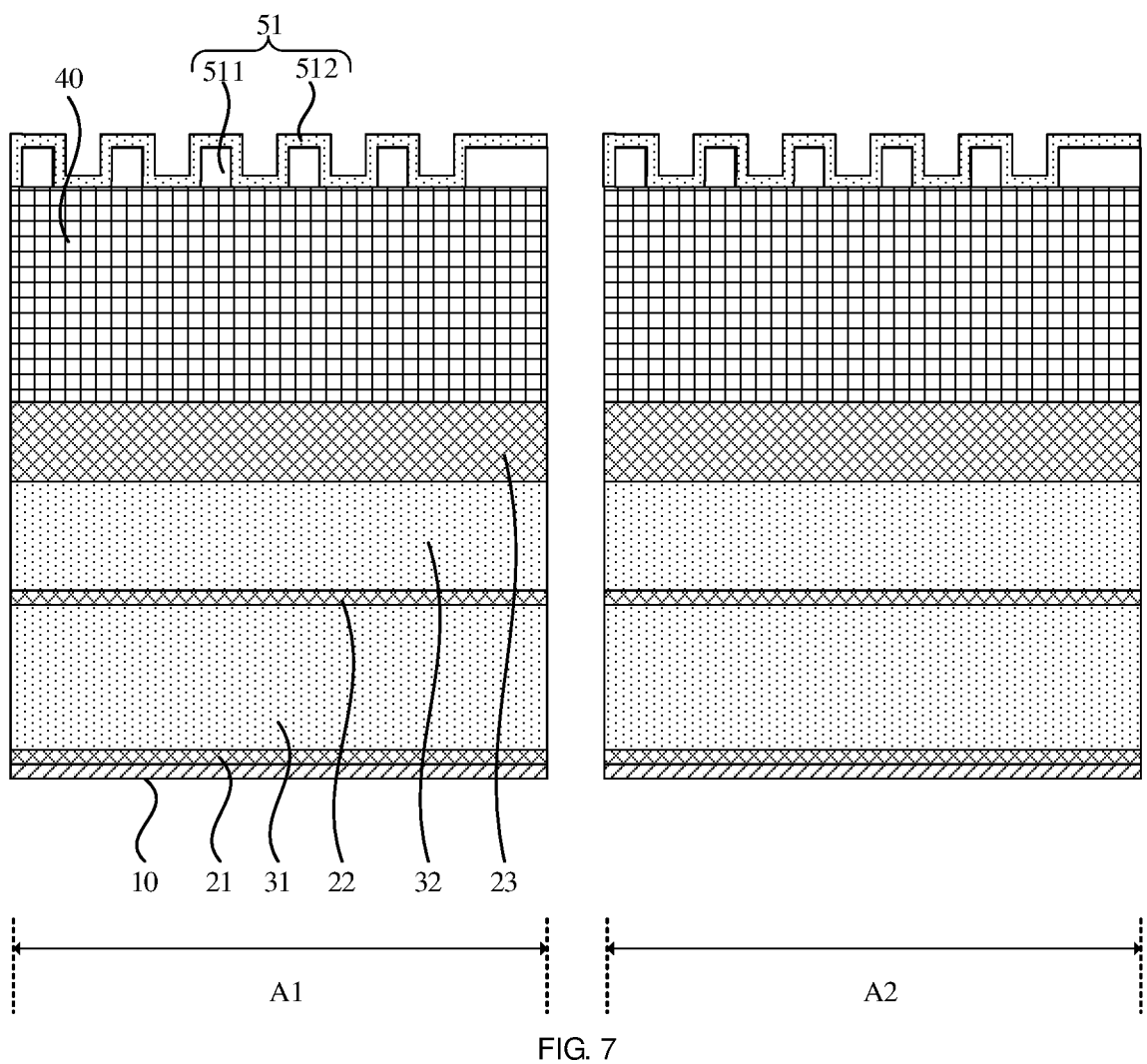
FIG. 7 is a schematic diagram of a structure obtained after implementing Step S103 of the manufacturing method of a semiconductor structure shown in FIG. 3.
Figure 8:
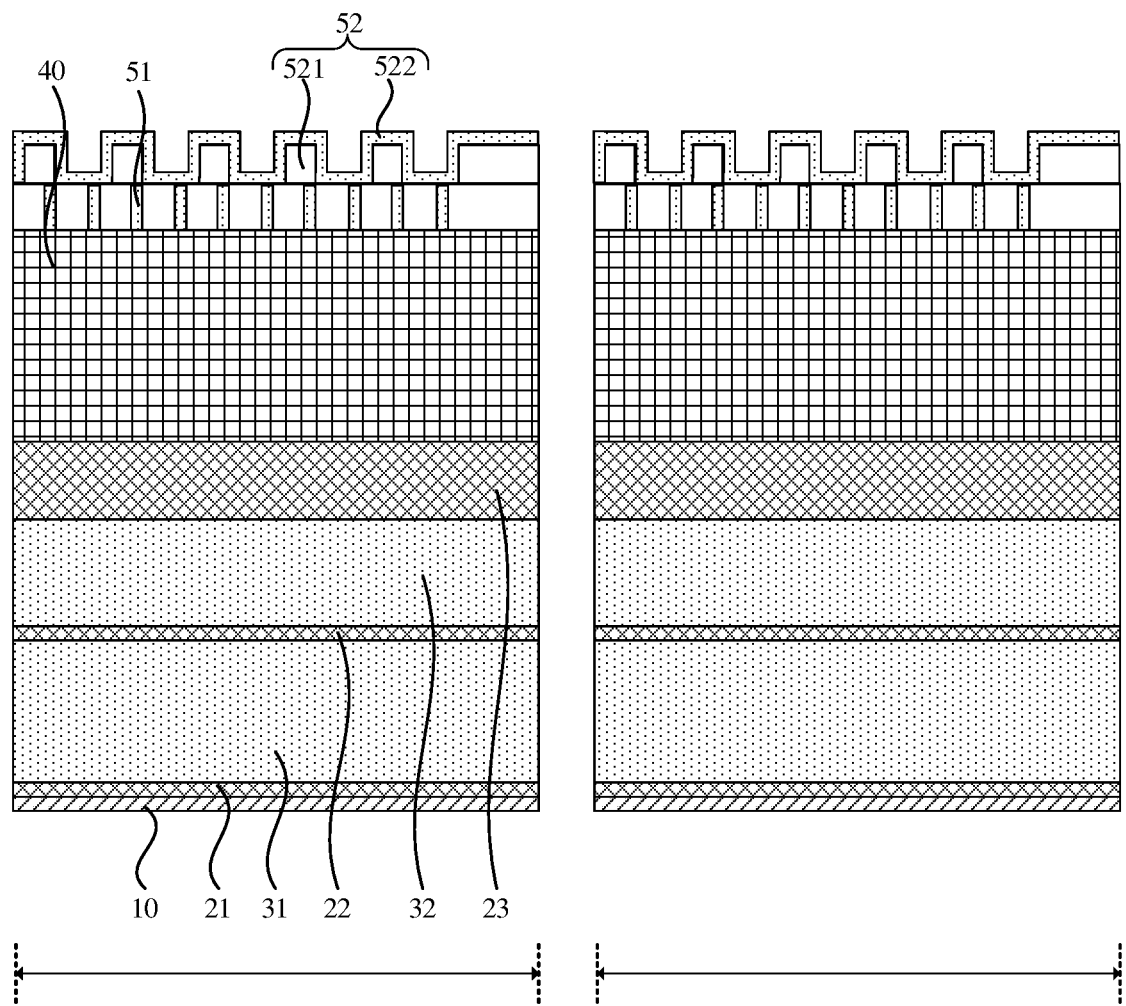
FIG. 8 is a schematic diagram of a structure obtained after forming a second mask layer 52 with a second pattern on a first mask layer 51 by the manufacturing method of a semiconductor structure shown in FIG. 3.
Figure 9:
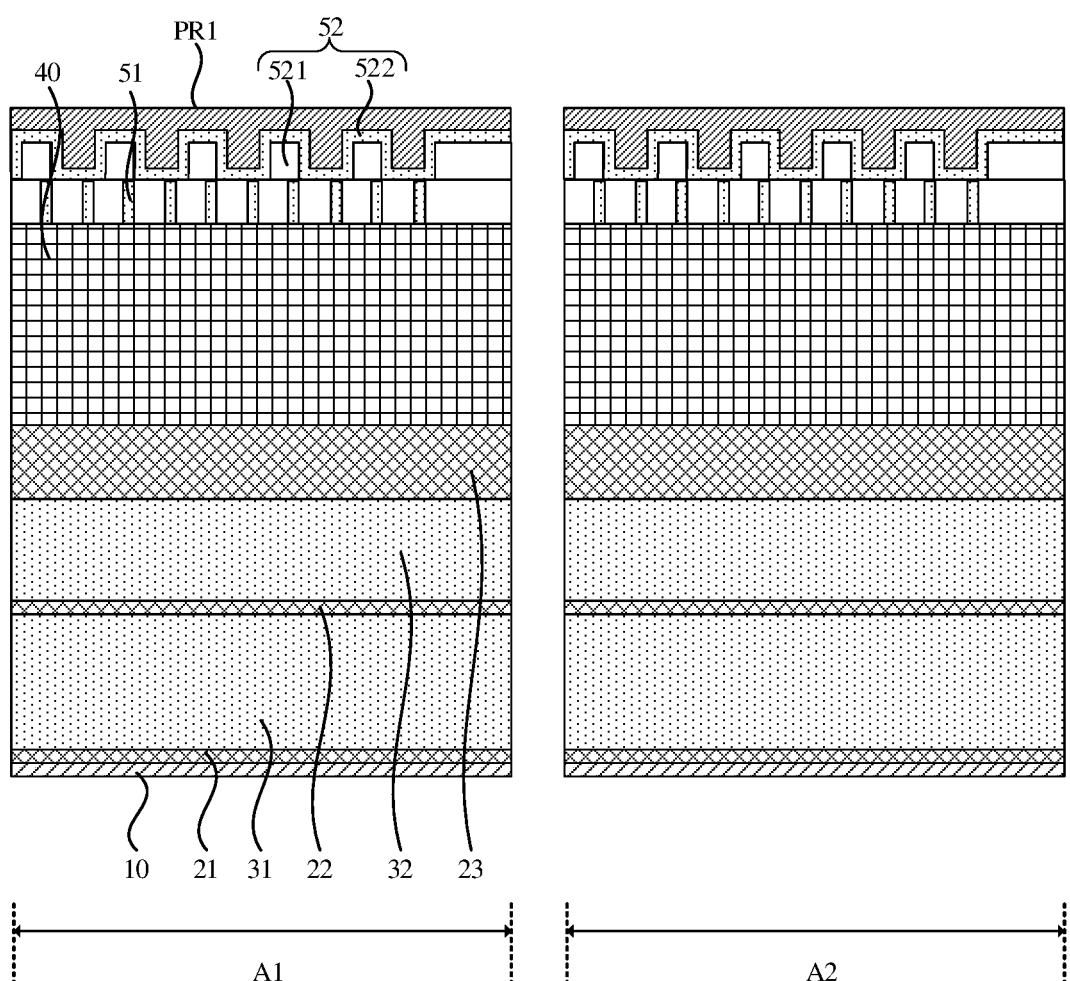
FIG. 9 is a schematic diagram of a structure obtained after implementing Step S104 of the manufacturing method of a semiconductor structure shown in FIG. 3.
Figure 10:
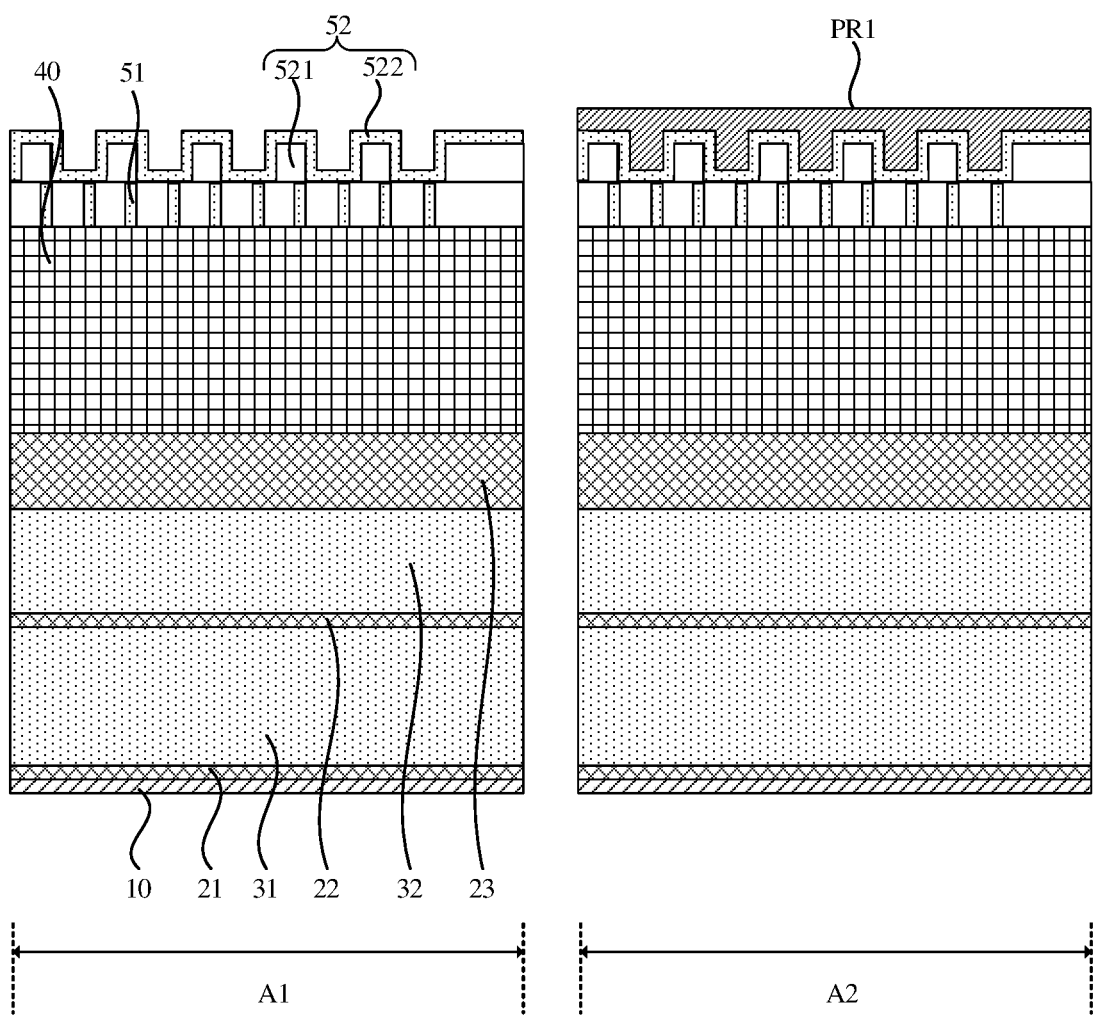
FIG. 10 is a schematic diagram of a structure obtained after implementing Step S105 of the manufacturing method of a semiconductor structure shown in FIG. 3.

FIG. 4 is a flowchart of another manufacturing method of a semiconductor structure according to an embodiment of the present disclosure; FIGS. 5 to 18 show the manufacturing process of the semiconductor structure according to the embodiment.

Referring to FIG. 4 and FIGS. 5 to 18, the manufacturing method of a semiconductor structure includes: S201: Provide a substrate 10, where the substrate 10 includes a complete die region A1 and an incomplete die region A2.

S202: Form a stack on the substrate 10, where the stack includes sacrificial layers and supporting layers.

S203: Form a first mask layer 51 with a first pattern on the stack.

S204 Form a first photoresist layer PR1 on the first mask layer 51.

S205: Expose the first photoresist layer PR1, and develop to remove the first photoresist layer PR1 on the complete die region A1.

S206: Etch the stack by using the first mask layer 51 on the complete die region A1 and the first photoresist layer PR1 on the incomplete die region A2 as masks.

S207: Form a third photoresist layer PR3 on the stack in which the capacitor holes are formed.

Before this step, capacitor holes may be formed in the stack. Further, before this step, bottom electrodes 60 may further be formed in the capacitor holes.

In this step, the third photoresist layer PR3 is formed by covering the complete die region A1 and the incomplete die region A2. The third photoresist layer PR3 may be a positive photoresist layer or a negative photoresist layer. When the third photoresist layer PR3 is a negative photoresist layer, the complete die region A1 is not exposed, and the incomplete die region A2 is exposed. The area of the incomplete die region A2 is smaller than that of the complete die region A1. Therefore, when the third photoresist layer PR3 is a negative photoresist layer, the area to be exposed is reduced.

S208: Expose the third photoresist layer PR3, and develop to remove the third photoresist layer PR3 on the complete die region A1.

In this step, the third photoresist layer PR3 is exposed and developed to remove the third photoresist layer PR3 on the complete die region A1 and retain the third photoresist layer PR3 on the incomplete die region A2. The third photoresist layer PR3 serves as a protective layer for the incomplete die region A2. The third photoresist layer PR3 is exposed by partial exposure, and developed to remove the third photoresist layer PR3 on the complete die region A1.

S209: Form a fourth photoresist layer PR4 on the third photoresist layer PR3 of the incomplete die region A2 and on the complete die region A1 after the development.

The fourth photoresist layer PR4 has opening patterns distributed in an array on the device region B1 of the complete die region A1, and the opening patterns intersect the sidewalls of the capacitor holes. Specifically, in a direction perpendicular to the substrate 10, the opening patterns intersect projections of the capacitor holes.

S210: Etch the bottom electrodes 60 in the capacitor holes and the supporting layers partially by using the third photoresist layer PR3 and the fourth photoresist layer PR4.

The opening patterns formed in Step S209 intersect the sidewalls of the capacitor holes. Therefore, in this step, the bottom electrodes 60 and the supporting layers exposed by the opening patterns can be partially etched away, thereby forming openings exposing the sacrificial layer, so as to remove at least one sacrificial layer by wet etching in a subsequent process.

In the embodiment of the present disclosure, the third photoresist layer PR3 is formed before the fourth photoresist layer PR4 is formed. In addition, the third photoresist layer PR3 on the complete die region A1 is removed, and the third photoresist layer PR3 on the incomplete die region A2 is retained. When the bottom electrodes 60 and the supporting layers on the substrate 10 are etched, on the incomplete die region A2, the third photoresist layer PR3 protects the stack on the incomplete die region A2 from being etched and patterned.

Figure 18:
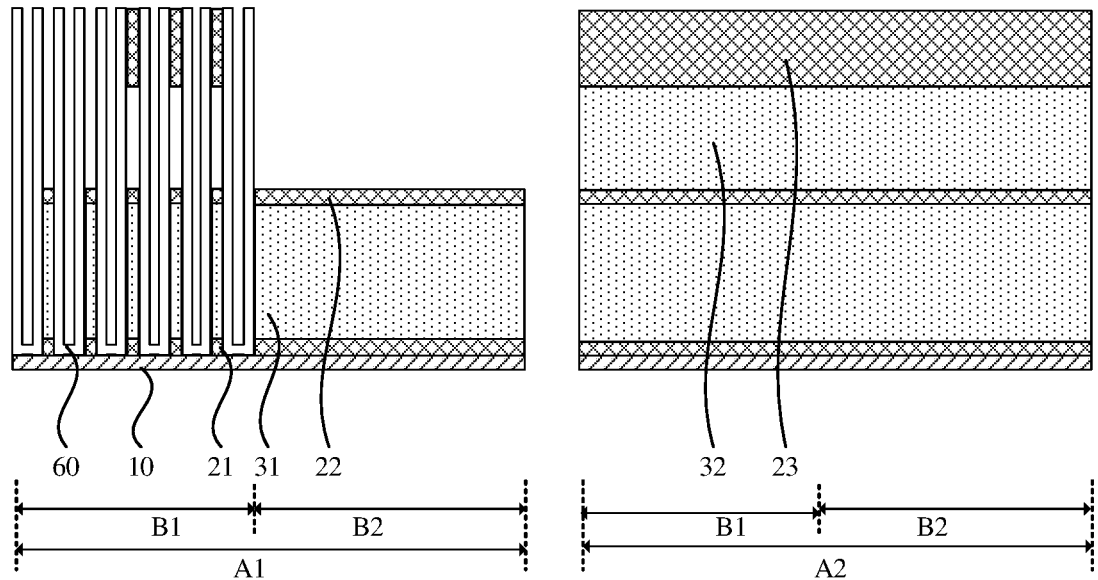
FIG. 18 is a schematic diagram of a structure obtained after implementing Step S210 of the manufacturing method of a semiconductor structure shown in FIG. 4.

In an embodiment, referring to FIG. 18, after Step S210, the manufacturing method of a semiconductor structure may further include: remove at least one sacrificial layer on the complete die region A1. For example, the third supporting layer 23 on the complete die region A1 may be removed, and the second sacrificial layer 32 on the complete die region A1 may be removed.

An embodiment of the present disclosure further provides a semiconductor structure, which is formed by a manufacturing method of a semiconductor structure provided by the present disclosure. In the embodiment of the present disclosure, the semiconductor structure is formed by the manufacturing method of a semiconductor structure provided by the present disclosure. The manufacturing method of a semiconductor structure includes the manufacturing method of a semiconductor structure in the above embodiment, which solves the problem that the edge of the wafer is prone to collapse and peeling during the formation of the semiconductor structure.

In an embodiment, the semiconductor structure includes a substrate 10, sacrificial layers and supporting layers which are alternately stacked, and bottom electrodes 60. The substrate 10 includes a complete die region A1 and an incomplete die region A2 located at the periphery of the complete die region A1. The alternately stacked sacrificial layers and supporting layers are located on the substrate 10. The number of sacrificial layers on the incomplete die region A2 is greater than that of sacrificial layers outside a region where bottom electrodes 60 are located on the complete die region A1.

In an embodiment, the number of supporting layers on the incomplete die region A2 is greater than that of supporting layers outside the region where the bottom electrodes 60 are located on the complete die region A1.

In an embodiment, the alternately stacked sacrificial layers and supporting layers include a first supporting layer 21, a first sacrificial layer 31, a second supporting layer 22, a second sacrificial layer 32 and a third supporting layer 23 along a direction away from the substrate 10. The first supporting layer 21, the first sacrificial layer 31 and the second supporting layer 22 are located on the complete die region A1 and the incomplete die region A2. The second sacrificial layer 32 and the third support layer 23 are located in a region where the bottom electrodes 60 are provided on the complete die region A1. The second sacrificial layer 32 and the third support layer 23 are not located in a region outside that where the bottom electrodes 60 are provided on the complete die region A1. The second sacrificial layer 32 and the third supporting layer 23 are also located on the incomplete die region A2.

A person skilled in the art can easily think of other implementation solutions of the present disclosure after considering the disclosure of the specification and practice. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

INDUSTRIAL APPLICABILITY

The present disclosure provides a manufacturing method of a semiconductor structure and a semiconductor structure. In the manufacturing method of a semiconductor structure, the first photoresist layer is formed before the stack is etched. In addition, the first photoresist layer on the complete die region is removed, and the first photoresist layer on the incomplete die region is retained. When the stack on the substrate is etched, on the complete die region, the pattern may be transferred to the stack. On the incomplete die region, the first photoresist layer protects the stack on the incomplete die region from being etched and patterned, thereby solving the problem that the edge of the wafer is prone to collapse and peeling during the formation of the semiconductor structure.

The invention claimed is:

1. A manufacturing method of a semiconductor structure, wherein the manufacturing method of the semiconductor structure comprises:
providing a substrate, wherein the substrate comprises a complete die region and an incomplete die region; the complete die region is composed of complete dies inside the substrate, and the incomplete die region is composed of incomplete dies at a periphery of the substrate;
each of the complete dies is a die that is completely disposed on the substrate and each of the incomplete dies is a die that is partially disposed on the substrate;
forming a stack on the substrate, wherein the stack comprises sacrificial layers and supporting layers;
forming a transition layer on the stack;
forming a first mask layer with a first pattern on the transition layer;
forming a first photoresist layer on the first mask layer, wherein the first photoresist layer is a negative photoresist layer;
exposing the first photoresist layer, and developing to remove the first photoresist layer on the complete die region, wherein the first photoresist layer on the incomplete die region is exposed by using a step exposure method;
etching the transition layer by using the first mask layer on the complete die region and the first photoresist layer on the incomplete die region as masks; and
etching the stack by using the transition layer as a mask.

2. The manufacturing method according to claim 1, wherein the transition layer comprises a multilayer film structure.

3. The manufacturing method according to claim 1, wherein the step exposure method is carried out without using a photomask, and a light spot in the step exposure method at least covers a single complete die of the complete dies.

4. The manufacturing method according to claim 3, wherein an area of the light spot in the step exposure method is smaller than an area of a single exposure unit.

5. The manufacturing method according to claim 3, wherein
the light spot in the step exposure method exactly completely covers the single complete die.

6. The manufacturing method according to claim 1, wherein the manufacturing method further comprises:
forming a second mask layer with a second pattern on the first mask layer, wherein the first photoresist layer is located on the second mask layer;
the first pattern comprises a first line along a first direction;
the second pattern comprises a second line along a second direction;
the first direction intersects the second direction.

7. The manufacturing method according to claim 6, wherein the first mask layer comprises a first mandrel layer and a first sidewall layer, and the first sidewall layer is formed on a surface of the first mandrel layer; the second mask layer comprises a second mandrel layer and a second sidewall layer, and the second sidewall layer is formed on a surface of the second mandrel layer.

8. The manufacturing method according to claim 7, wherein the manufacturing method further comprises:
forming a second photoresist layer on the first photoresist layer of the incomplete die region and on the complete die region after a development of the second photoresist layer;
wherein, the second photoresist layer does not cover a device region on the complete die region, but covers a peripheral region on the complete die region;
the second photoresist layer does not cover a device region on the incomplete die region, but covers a peripheral region on the incomplete die region.

9. The manufacturing method according to claim 8, wherein the manufacturing method further comprises:

etching by using the transition layer, the first mask layer, the second mask layer, the first photoresist layer and the second photoresist layer as masks to form capacitor holes in the stack; and forming bottom electrodes in the capacitor holes, wherein the bottom electrodes cover sidewalls and bottoms of the capacitor holes.

10. The manufacturing method according to claim 9, wherein the manufacturing method further comprises:

forming a third photoresist layer on the stack in an area of the stack where the capacitor holes are formed; and exposing the third photoresist layer, and developing to remove the third photoresist layer on the complete die region.

11. The manufacturing method according to claim 10, wherein the third photoresist layer is a negative photoresist layer.

12. The manufacturing method according to claim 10, wherein the manufacturing method further comprises: forming a fourth photoresist layer on the third photoresist layer of the incomplete die region and on the complete die region after a development of the fourth photoresist layer;

wherein, the fourth photoresist layer has opening patterns distributed in an array on the device region on the complete die region, and the opening patterns intersect the sidewalls of the capacitor holes.

13. The manufacturing method according to claim 12, wherein the manufacturing method further comprises: etching the bottom electrodes in the capacitor holes and the supporting layers partially by using the third photoresist layer and the fourth photoresist layer.

14. The manufacturing method according to claim 13, wherein the manufacturing method further comprises:

removing at least one of the sacrificial layers on the complete die region.

\* \* \* \* \*